(12) United States Patent
Tang et al.

(10) Patent No.: US 9,041,426 B2
(45) Date of Patent: May 26, 2015

(54) DEFAULT CURRENT TEST METHOD OF IMPULSE VOLTAGE MIXED HIGH VOLTAGE DIRECT CURRENT CONVERTER VALVE

(75) Inventors: Guang fu Tang, Beijing (CN); Kunpeng Zha, Beijing (CN); Jun Yang, Beijing (CN); Chong Gao, Beijing (CN)

(73) Assignees: STATE GRID SMART GRID RESEARCH INSTITUTE, Beijing (CN); STATE GRID CORPORATION OF CHINA, Beijing (CN); CHINA-EPRI ELECTRIC POWER ENGINEERING CO., LTD., Beijing (CN); CHINA ELECTRIC POWER RESEARCH INSTITUTE, Beijing (CN)

( * ) Notice: Subject to any disclaimer, the term of this patent is extended or adjusted under 35 U.S.C. 154(b) by 650 days.

(21) Appl. No.: 13/255,508

(22) PCT Filed: Jun. 16, 2011

(86) PCT No.: PCT/CN2011/001001
§ 371 (c)(1),
(2), (4) Date: Sep. 9, 2011

(87) PCT Pub. No.: WO2012/071773
PCT Pub. Date: Jun. 7, 2012

(65) Prior Publication Data
US 2013/0193998 A1    Aug. 1, 2013

(30) Foreign Application Priority Data

Dec. 1, 2010 (CN) .......................... 2010 1 0576687

(51) Int. Cl.
*G01R 31/40* (2014.01)
*G01R 31/02* (2006.01)
*H02H 9/08* (2006.01)
*H02H 9/00* (2006.01)
*G01R 31/26* (2014.01)

(52) U.S. Cl.
CPC .............. *G01R 31/40* (2013.01); *G01R 31/263* (2013.01)

(58) Field of Classification Search
CPC ....... G01R 31/40; G01R 21/06; G01R 31/263
USPC ..................................... 324/764.01
See application file for complete search history.

(56) References Cited

U.S. PATENT DOCUMENTS

| | | | | | |
|---|---|---|---|---|---|
| 3,461,384 | A | * | 8/1969 | Peiser et al. | 324/96 |
| 3,590,359 | A | * | 6/1971 | Bossi et al. | 363/144 |
| 4,056,776 | A | * | 11/1977 | Olsson et al. | 324/762.01 |
| 4,392,175 | A | * | 7/1983 | Takigami et al. | 361/88 |
| 4,471,301 | A | * | 9/1984 | Durov et al. | 324/764.01 |

(Continued)

*Primary Examiner* — Jermele M Hollington
*Assistant Examiner* — Christopher McAndrew
(74) *Attorney, Agent, or Firm* — Novak Druce Connolly Bove + Quigg LLP

(57) ABSTRACT

The present invention provides to a default current testing method of the high voltage direct current converter valve composited by impulse voltage. The technical scheme of the invention composites the symmetrical positive and negative voltage and the impulse into asymmetric positive and negative high voltage, it makes the test valve voltage accurately achieve required peak value at the set time. The test circuit is simple relatively; the high voltage source of the default current test circuit is instead by surge generators. The test method is flexible, safe, and suitable for different DC project converter valves.

7 Claims, 3 Drawing Sheets

(56) References Cited

U.S. PATENT DOCUMENTS

| | | | |
|---|---|---|---|
| 4,600,917 A * | 7/1986 | Seki et al. | 340/645 |
| 4,884,025 A * | 11/1989 | Hausler | 324/762.01 |
| 5,384,528 A * | 1/1995 | Leowald et al. | 323/209 |
| 5,521,526 A * | 5/1996 | Nyberg et al. | 324/762.01 |
| 5,986,903 A * | 11/1999 | Svensson et al. | 363/51 |
| 6,040,639 A * | 3/2000 | Ginell et al. | 307/44 |
| 6,205,039 B1 * | 3/2001 | Åstrom et al. | 363/50 |
| 6,459,175 B1 * | 10/2002 | Potega | 307/149 |
| 6,545,884 B2 * | 4/2003 | Curtiss | 363/37 |
| 6,567,759 B2 * | 5/2003 | Dollar, II | 702/58 |
| 6,633,824 B2 * | 10/2003 | Dollar, II | 702/58 |
| 6,654,222 B2 * | 11/2003 | Jungst et al. | 361/93.9 |
| 7,327,542 B2 * | 2/2008 | Juengst et al. | 361/58 |
| 7,397,267 B2 * | 7/2008 | Wang | 324/750.3 |
| 7,443,692 B2 * | 10/2008 | Patwardhan et al. | 361/775 |
| 7,750,501 B2 * | 7/2010 | Huang | 307/45 |
| 7,821,282 B2 * | 10/2010 | Kurahashi et al. | 324/764.01 |
| 8,044,678 B2 * | 10/2011 | Kao et al. | 324/764.01 |
| 8,120,380 B2 * | 2/2012 | Heiman et al. | 324/764.01 |
| 8,217,677 B2 * | 7/2012 | Starkell et al. | 324/764.01 |
| 8,604,821 B2 * | 12/2013 | Sugiura et al. | 324/764.01 |
| 2004/0227538 A1 * | 11/2004 | Harris | 324/763 |
| 2006/0071682 A1 * | 4/2006 | Hashimoto | 324/771 |
| 2007/0013409 A1 * | 1/2007 | Chae | 324/771 |
| 2007/0253131 A1 * | 11/2007 | Juengst et al. | 361/93.9 |
| 2008/0074133 A1 * | 3/2008 | Andoh et al. | 324/763 |
| 2008/0204064 A1 * | 8/2008 | Zhang et al. | 324/765 |
| 2008/0284392 A1 * | 11/2008 | Itoh | 323/277 |
| 2009/0058454 A1 * | 3/2009 | An et al. | 324/765 |
| 2009/0140745 A1 * | 6/2009 | Williams et al. | 324/522 |
| 2009/0179660 A1 * | 7/2009 | Kejariwal et al. | 324/763 |

* cited by examiner

DEFAULT CURRENT TEST METHOD OF IMPULSE VOLTAGE MIXED HIGH VOLTAGE DIRECT CURRENT CONVERTER VALVE

FIELD OF THE INVENTION

The invention relates to a direct current converter valve testing method, in particular, relates to a default current testing method of the high voltage direct current converter valve composited by impulse voltage.

BACKGROUND OF THE INVENTION

With the wide application of the high voltage direct current transmission technology in the electrical power system, the reliability of the core part—the high voltage and high power thyristor valves become the key of the system safety. The default current test is concern to the thyristor valves design and fabrication level, and it is the important test method to improve its reliability. The main objective is to the design is right when the valves afford the maximum current, voltage and temperature stress result from short circuit current. At present, in the default current test the synthetic test concept is commonly used. And its basic idea is to use direct current source, default current source, high voltage source and so on, a sets of power system provides heating current, default current and the forward and reverse voltage for the converter valve, separately. The synthetic test circuit can complete the two following trials:

a) Subsequent locking single wave default current test inhibiting a maximum amplitude single wave default current, beginning with the highest temperature and then locking the forward and reverse voltage including any over voltage due to load rejection;

b) Non-subsequent locking multiwave default current test: under the same test condition to the single wave test, existing multi-wave default current before the breaker trips, but no more positive voltage supply.

At present, the high voltage source of the test circuit is consisted of L-C oscillation circuit, and the high voltage waveform is symmetrical. For the single wave default current test, the forward and reverse voltage amplitude provided for the test sample are same after the default current is off. But under the actual working condition, the test valve first gets reverse voltage and then the voltage reaches the positive maximum value and the reverse voltage peak value less than positive peak value after experiencing default current, the test valve temperature reduces gradually in the process. General speaking, the reverse over high voltage provided by the test circuit is very adverse for the valve that has withstood temperature default current, and that may damages the test valve. In addition, the time of the valve withstands positive voltage peak is after 5 ms the reverse voltage passed in actual working condition. For normal synthetic test circuit, in order to achieve the requirement must modify the circuit parameters, which results in the investment increase and test operation inconvenience.

SUMMARY OF THE INVENTION

The invention provides a default current testing method of the high voltage direct current converter valve composited by impulse voltage, it composes the symmetrical positive and negative voltage and the impulse voltage into asymmetric positive and negative high voltage, and the time of the impulse voltage can be chosen arbitrarily, the amplitude is continuously adjustable according to need, which can make the test valve voltage accurately achieve required peak value at the given moment. The test method is flexible, safe, and suitable for different DC project converter valves.

A default current testing method of the high voltage direct current converter valve composed by impulse voltage provided by the invention, the device used for said test method comprises a test valve 1, a direct current source 2, an auxiliary valve 3, and a default current source 4, is characterized that, wherein said method also includes a surge generator 5; Said surge generator 5 is connected with said test valve 1 in parallel, and then connected with said auxiliary valve 3 in series; Said test valve 1 and said auxiliary valve 3 are connected in series as the bridge arm of the 6 pulse bridges rectifier B6 in the direct current source 2. The inductor L of said default current source 4 is connected with said surge generator 5 in parallel.

In the first preferably technical solution provided by the invention: said default current source 4 includes a direct current voltage source T1, voltage regulator T2, capacitors, a reactor, isolation valves, a resistor and switches; Capacitors include capacitor C1, C2 and C3 connected with each other in parallel, the reactor is L, the isolation valves include V1, V2, and V3 connected with each other in parallel, the resistor is R, the switches include S1, S2, and S3 connected with each other in parallel; Said isolation valve V1, V2 and V3, capacitor C1, C2 and C3, switches S1, S2, and S3 are connected with the reactor L in series; Said resistor R is connected with switches S1, S2, and S3 in series; the output end of said direct current voltage source T1 is connected with the resistor R; said switch S1, S2, and S3 are connected with the isolation valve V1, V2 and V3, respectively; said voltage regulator T2 is connected with said direct current voltage source T1 in parallel.

In the second preferably technical solution provided by the invention: said direct current source (2) in said test device comprises a large current transformer T, breakers, discounters, limiting reactors, reactor Lh and L1, and a 6 pulse bridges rectifier B6; Said large current transformer T, breakers, discounters, and limiting reactors are connected in series; the output ends of the 6 pulse bridges rectifier B6 are connected with the reactor Lh and L1, respectively.

The third preferably technical solution provided by the invention, said method comprises following steps:

A, The DC current source 2 sets up and makes the output current to reach heating current value, turn on the switches of the default current source 4 to make the capacitors charge, and the voltage of the capacitors required value;

B, Turn on said auxiliary valve 3, the current provided by the DC current source 2 passes the test valve 1 and heats it;

C, After the test valve 1 is heated to a certain junction temperature, turn on the auxiliary valve V1, V2 and V3 of the default current source 4, and the default current passes the test valve 1, and produces default voltage of the test valve 1;

D, Triging said surge generator 5, the surge generator 5 provides impulse voltage for the test valve 1, and it and the default voltage of the default current source 4 compose the voltage of the test valve 1.

In the fourth preferable technical solution provided by the invention: in said step A, turn on the switch S1 of the default current source (4) to charge the capacitor C1, and the voltage of C1 is up to required value in single wave default current test; While in three waves default current test, turn on the switch S1, S2 and S3 of the ﬁ default current source (4) and charge the capacitor C1, C2, and C3, respectively and the voltage of C1, C2, and C3 are all up to required value.

In the fifth preferable technical solution provided by the invention: in said step C, the default current source 4 provides reverse voltage and part of forward voltage for the test valve 1 in single wave default current test; In said step D, said impulse voltage is forward voltage in single wave default current test; In three wave default current test, said impulse voltage is reverse voltage, and is supplied for the test valve 1 after the second default current passing.

In the sixth preferable technical solution provided by the invention: in said method, the symmetrical positive and negative voltage, and the impulse compose asymmetric positive and negative high voltage, it makes the test valve voltage accurately achieve required peak value at the set time.

The default current testing method of the high voltage direct current converter valve composed by impulse voltage provided by the invention, whose test circuit is simple relatively, saves the high voltage source than the common default current test circuit by surge generators instead of the high voltage source, the symmetrical positive and negative voltage and the impulse voltage is composed into asymmetric positive and negative high voltage, and the time of the impulse voltage can be chosen arbitrarily, the amplitude is continuously adjustable according to need, which can make the test valve voltage accurately achieve required peak value at the given moment. The test method is flexible, safe, and suitable for different DC project converter valves.

DETAILED DESCRIPTION OF EMBODIMENTS

Figure 1:
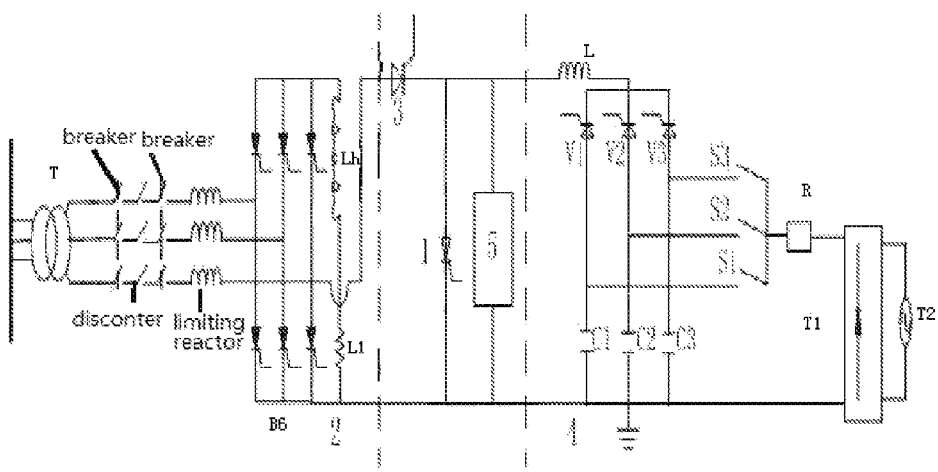
FIG. 1 is the default current testing device of the high voltage direct current converter valve composed by impulse voltage.

The detail of the embodiments is described as below incorporated with the figures by way of cross-reference for the present invention.

It shows the default current testing device of the high voltage direct current converter valve composited by impulse voltage, the device includes a test valve 1, a direct current source 2, an auxiliary valve 3, a default current source 4 and a surge generator 5. The surge generator 5 is connected with the test valve 1 in parallel, and then connected with the auxiliary valve 3 in series. The test valve 1 and the auxiliary valve 3 are connected in series as the bridge arm of the pulse bridge rectifier B6 in the direct current source 2. The inductor L of the default current source 4 is connected with the surge generator 5 in parallel.

In test the direct current (DC) source 2 provides the heating current for the test valve 1 to ensure the junction temperature up to a base value before the default current coming. The auxiliary valve 3 will isolate the DC current source 2 after the heating current off. When the test valve 1 is heated a certain temperature, the default current source 4 will provide default current for the test valve 1, and it will also provide reverse voltage and part of forward voltage for the test valve 1 in single wave default current test. The surge generator 5 provides the impulse voltage for the test valve 1, in single wave default current the impulse is forward voltage, the voltage and the forward voltage provided by the default current source 4 compose a forward voltage for the test valve 1 to restrain a largest amplitude single wave default current. In three waves default current test, the impulse voltage is reverse voltage, and it adds onto test valve 1 after the second default current.

Figure 2:
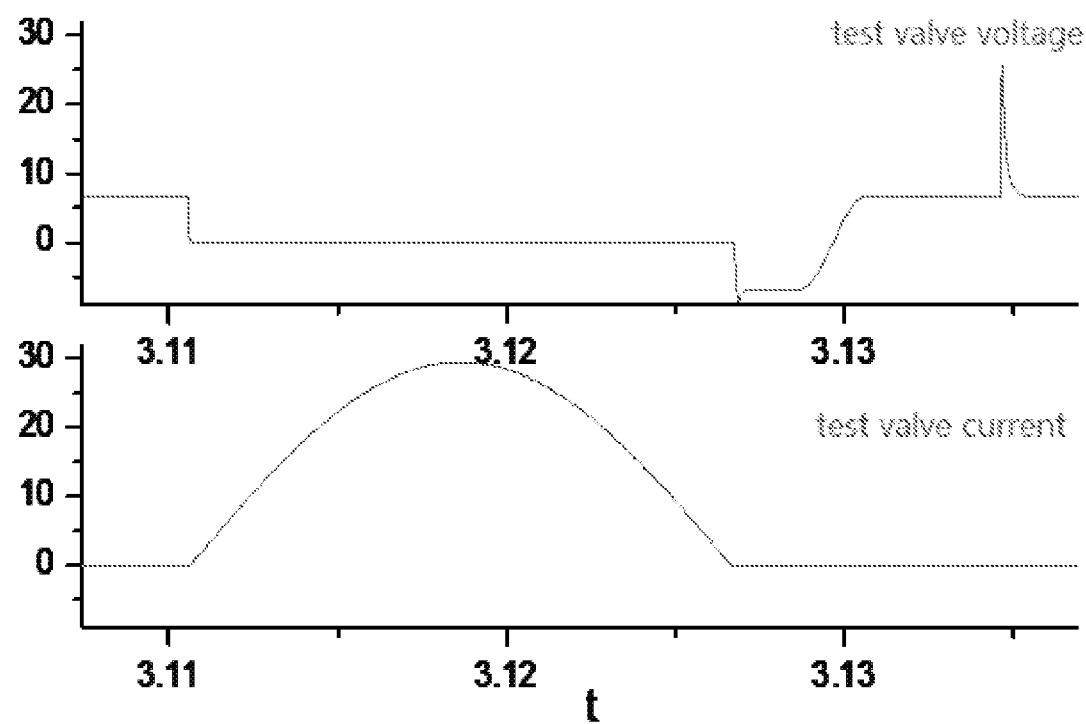
FIG. 2 is the waveform of subsequent locking single wave default current test.

FIG. 2 shows the waveform of subsequent locking single wave default current test. In single wave default current test the impulse voltage is forward voltage, and It and the forward voltage provided by the default current source compose the test valve forward voltage, to inhibit a maximum amplitude single wave default current, beginning with the highest temperature and then locking the forward and reverse voltage including any over voltage due to load rejection.

Figure 3:
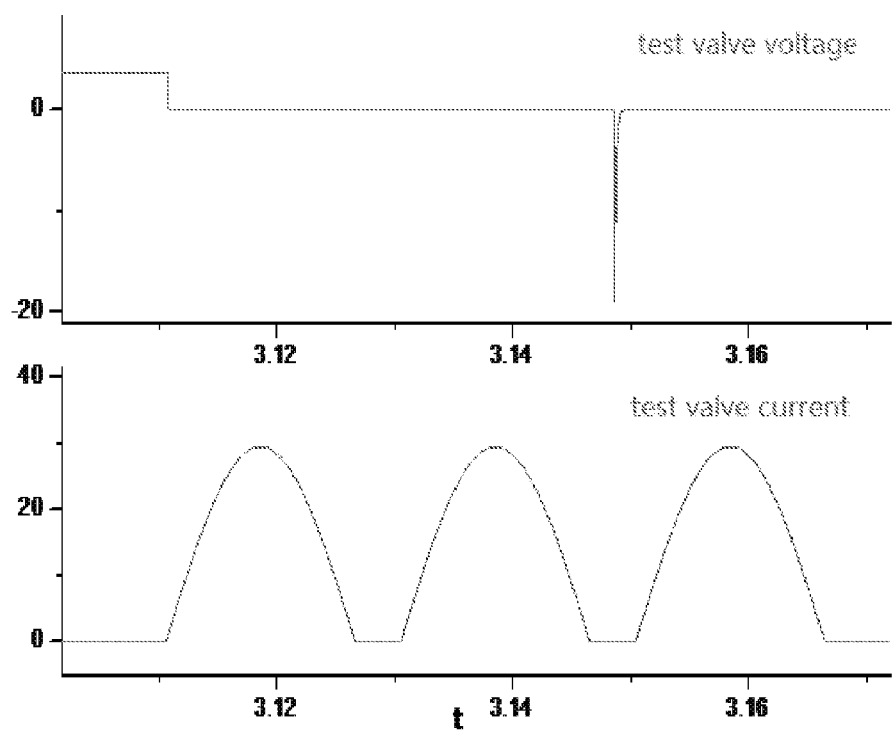
FIG. 3 is the waveform of no-subsequent locking multi wave default current test.

The steps of the single wave default current test are as follows:

1) The DC current source 2 sets to working and to make the output current reach heating current value, turning on the switch S1 of the default current source 4 to make the capacitor C1 charge and the voltage reach required value;

2) The auxiliary valve 3 turned on, the current provided by the DC current source 2 passes the test valve 1 and preheats it;

3) After that, the auxiliary valve 3 is turned off, turning on the auxiliary valve V1 of the default current source 4 to make the test valve 1 bear the default current;

4) The default current is extinguished to make the voltage of charge capacitor reverse and the test valve 1 bear reverse voltage;

5) The capacitor C1 is charged again to make the voltage reach the value before default 6) 5 ms after the default current passing, trigging the surge generator 5, and provides the forward impulse voltage for the test valve 1;

FIG. 3 shows the waveform of no-subsequent locking multi wave default current test. In three waves default current test, the impulse voltage is reverse voltage, and it adds onto test valve 1 after the second default current. Same to the single wave test conditions, it there has being multi default current until the breaker is off, but there is no more forward voltage.

The steps of the three waves default current test are as follows:

1) The DC current source 2 sets to working to make the output current reach heating current value, turn on the switches S1, S2, S3 of the default current source 4 to make the capacitor C1, C2 and C3 charge, and the voltages reach required value;

2) Turn on the auxiliary valve 3, the current provided by the DC current source 2 passes the test valve 1 and preheats it;

3) After that, turn off the auxiliary valve 3, turn on the auxiliary valve V1 of the default current source 4 to make the test valve 1 bear the first default current pass;

4) Turn on the auxiliary valve V2 of the default current source 4 to make the test valve 1 the bear second default current pass;

5) 5 ms after the default current passing, trigging the surge generator 5, and provides the reverse impulse voltage for the test valve 1;

6) Turn on the auxiliary valve V3 of the default current source 4, and the three default current passes the test valve 1;

The test circuit provided by the invention is simple, the high voltage source of the default current test circuit is instead by surge generators, and it solves the reverse and forward voltage symmetrical problems of the test valve, which makes the test safer. Because the time of the impulse voltage, and the amplitude are both continuously adjustable, which make the test valve voltage accurately achieve required peak value at the set time. The test method is flexible, safe, and suitable for different DC project converter valves.

At last, in this description of the embodiments, we have detail describe the present invention according to a particular example. The detail embodiment is one example of the invention but not the only one, so the person in this field must be understand that all the alternatives and other equal and/or similar examples are all within the range of the invention and they are all consistent with the spirits of this invention, are all protected by our claims.

The invention claimed is:

1. A default current testing apparatus for testing the high voltage direct current converter valve by impulse voltage, the apparatus comprising:
    a test valve;
    a direct current source;
    an auxiliary valve;
    a default current source; and
    a surge generator, wherein the said surge generator is connected with said test valve in parallel, and is connected with said auxiliary valve;
    wherein the default current source includes
    a direct current voltage source;
    a voltage regulator;
    a capacitor;
    a reactor;
    a plurality of isolation valves including a first isolation valve, a second isolation valve and a third isolation valve each connected with each other in parallel;
    a resistor;
    a plurality of switches including a first switch, a second switch and a third switch each connected with each other in parallel; and
    a plurality of capacitors including a first capacity, a second capacity and a third capacity each connected with each other in parallel,
    wherein each of the first isolation valve, the second isolation value and third isolation valve, the first capacitor, the second capacitor and the third capacitor, the first switch, the second switch, and the third switch is connected with the reactor in series;
    wherein the resistor is connected with the first switch, the second switch and the third switch in series;
    wherein an output end of the direct current voltage source is connected with the resistor;
    wherein the first switch, the second switch and the third switch are connected with the first isolation valve, the second isolation valve and the third isolation valve; and
    wherein the voltage regulator is connected with the direct current voltage source in parallel.

2. The default current testing apparatus of claim 1, wherein said test valve connects with said auxiliary valve to form as a bridge arm of a pulse bridges rectifier in said direct current source, and an inductor of said default current source connects with said surge generator in parallel.

3. A default current testing device for testing the high voltage direct current converter valve by impulse voltage, the device comprising:
    a test valve;
    a direct current source;
    an auxiliary valve;
    a default current source; and
    a surge generator, wherein the said surge generator is connected with said test valve in parallel, and is connected with said auxiliary valve,
    wherein the default current source includes
    a direct current voltage source;
    a voltage regulator;
    a capacitor;
    a reactor;
    a plurality of isolation valves including a first isolation valve, a second isolation valve and a third isolation valve each connected with each other in parallel;
    a resistor;
    a plurality of switches including a first switch, a second switch and a third switch each connected with each other in parallel; and
    a plurality of capacitors including a first capacity, a second capacity and a third capacity each connected with each other in parallel,
    wherein each of the first isolation valve, the second isolation value and third isolation valve, the first capacitor, the second capacitor and the third capacitor, the first switch, the second switch, and the third switch is connected with the reactor in series;
    wherein the resistor is connected with the first switch, the second switch and the third switch in series;
    wherein an output end of the direct current voltage source is connected with the resistor;
    wherein the first switch, the second switch and the third switch are connected with the first isolation valve, the second isolation valve and the third isolation valve; and
    wherein the voltage regulator is connected with the direct current voltage source in parallel.

4. The default current apparatus of claim 1, wherein the direct current voltage source includes:
    a large current transformer;
    one or more breakers;
    one or more discounters;
    one or more limiting reactors; and
    a pulse bridge rectifier,
    wherein the large current transformer, the one or more breakers, the one or more discounters, and one or more reactors are connected in series.

5. A default current testing system for testing the high voltage direct current converter valve by impulse voltage, the system comprising:
    a test valve;
    a direct current source;
    an auxiliary valve;
    a default current source; and
    a surge generator, wherein the said surge generator is connected with said test valve in parallel, and is connected with said auxiliary valve;
    wherein the default current source includes
    a direct current voltage source;
    a voltage regulator;
    a capacitor;
    a reactor;
    a plurality of isolation valves including a first isolation valve, a second isolation valve and a third isolation valve each connected with each other in parallel;
    a resistor;
    a plurality of switches including a first switch, a second switch and a third switch each connected with each other in parallel; and
    a plurality of capacitors including a first capacity, a second capacity and a third capacity each connected with each other in parallel,
    wherein each of the first isolation valve, the second isolation value and third isolation valve, the first capacitor, the second capacitor and the third capacitor, the first switch, the second switch, and the third switch is connected with the reactor in series;
    wherein the resistor is connected with the first switch, the second switch and the third switch in series;
    wherein an output end of the direct current voltage source is connected with the resistor;
    wherein the first switch, the second switch and the third switch are connected with the first isolation valve, the second isolation valve and the third isolation valve; and wherein the voltage regulator is connected with the direct current voltage source in parallel.

6. The default current testing system of claim 1, wherein said test valve connects with said auxiliary valve to form as a bridge arm of a pulse bridges rectifier in said direct current source, and an inductor of said default current source connects with said surge generator in parallel.

7. The default current system of claim 5, wherein the direct current voltage source includes:
   a large current transformer;
   one or more breakers;
   one or more discounters;
   one or more limiting reactors; and
   a pulse bridge rectifier,
   wherein the large current transformer, the one or more breakers, the one or more discounters, and one or more reactors are connected in series.

* * * * *